US012355205B2

(12) United States Patent
Yearim et al.

(10) Patent No.: US 12,355,205 B2
(45) Date of Patent: Jul. 8, 2025

(54) LASER SYSTEM

(71) Applicant: Maradin Ltd., Yoqne'am (IL)

(72) Inventors: Gad Yearim, Haifa (IL); Adi Baram, Yoqneam (IL); Menashe Yehiel, Moshav Yogev (IL); Matan Naftali, Moshav Aloney-Aba (IL)

(73) Assignee: MARADIN LTD., Yoqne'am (IL)

( * ) Notice: Subject to any disclaimer, the term of this patent is extended or adjusted under 35 U.S.C. 154(b) by 665 days.

(21) Appl. No.: 17/662,588

(22) Filed: May 9, 2022

(65) Prior Publication Data
US 2023/0361527 A1 Nov. 9, 2023

(51) Int. Cl.
*H01S 5/026* (2006.01)
*H01S 5/042* (2006.01)
*H01S 5/06* (2006.01)
*H01S 5/0683* (2006.01)

(52) U.S. Cl.
CPC .......... *H01S 5/0261* (2013.01); *H01S 5/0427* (2013.01); *H01S 5/0617* (2013.01); *H01S 5/0683* (2013.01)

(58) Field of Classification Search
CPC ...................................................... H01S 5/0261
USPC ........................................................ 372/38.02
See application file for complete search history.

(56) References Cited

U.S. PATENT DOCUMENTS

| | | | |
|---|---|---|---|
| 10,277,873 B2 | 4/2019 | Naftali et al. | |
| 2017/0214893 A1* | 7/2017 | Naftali | H04N 9/3161 |
| 2017/0256192 A1* | 9/2017 | Knepper | G09G 3/3607 |

* cited by examiner

*Primary Examiner* — Tuan N Nguyen
(74) *Attorney, Agent, or Firm* — FISHERBROYLES, LLP; Roger L. Browdy; James E. Mrose

(57) ABSTRACT

A laser system comprising laser driver/s and controller/s which receive/s, from a pixel source, black and non-black pixel values each associated with a time interval, each including color component/s, and responsively, controls the laser driver to provide, to the laser diode: non-zero current during a first time interval associated with non-black pixel value/s and zero current during a second time interval associated with black pixel value/s. The laser diode thus projects light during the first time interval but not during the second time interval, yielding a display including non-black regions corresponding to non-black pixel values and true-black regions corresponding to black pixel values.

18 Claims, 8 Drawing Sheets

Fig. 5

Operation 500: typically, a system user defines, e.g. via a UI or API string, a "black level" e.g. the black light projection level for black pixel +1 e.g. according to how the laser diode curve at threshold point is different from ideal curve.

Operation 510: Adjust color (DAC A setting) including:
- Set Channel_Thr register = Black_thr for all laser driver (LDR) channels, typically including forcing K=1 for all channels
- Adjust brightness e.g. by setting Data_in = Data_max
adjust DAC A setting (gain) for maximum brightness required by use-case e.g. as defined by user typically via a UI or API , including, for RGB projection, setting all three pixel data_in components to Data_max
and adjusting the setting of Digital to Analog Converter A of each laser driver (LDR) channel for maximum required white brightness.

Operation 520: Adjust threshold (Thr register setting) including adjusting threshold current for Data_in = black pixel value + 1 (Data_in = Black_Thr+1) by adjusting Channel_Thr register to get a required black level.
typically, in operations 1 and 2 - Digital to Analog Converter B is blocked (I_thr = 0).

Operation 530 (typically performed only when dimming by changing gain for Digital to Analog Converter A in laser driver (LDR)): if dimming is performed, using a laser driver (LDR) _dimm method as described in the above-referenced co-owned patent, and/or if LDR_dimm > 1, then,
assuming DAC_B_Thr is the threshold current generated by Digital to Analog Converter B, Set Channel_Thr = Black_thr. Then, repeat operation 520 by adjusting DAC_B_Thr, the threshold current generated by Digital to Analog Converter B, instead of Channel_Thr register to yield the black level defined in operation 0. Save DAC_B_Thr for use when laser driver (LDR) _Dimm > 1.

FIG. 7

Operation 7a. Detect True black

↓

Operation 7b. check if there are black pixels in display buffer

↓

Operation 7c. if there are more than 1 black pixels in the display buffer, activate true black

↓

Operation 7d: if there are zero black pixels in the display buffer, go back to threshold current

LASER SYSTEM

FIELD OF THIS DISCLOSURE

The present invention relates generally to laser technology and more particularly to laser drivers.

BACKGROUND OF THIS DISCLOSURE

When a process of pixel value calculation generates fraction values, these fraction values may undergo spatial dithering and/or temporal dithering, to generate un-fractioned pixel values that take these fractions into account. In spatial dithering the un-fractioned pixels are generated by combining fractions of neighboring pixels using some weight assigned to each neighboring pixel. In temporal dithering the fraction of each pixel and a random number generator are used, to generate the un-fractioned pixel value.

The following 3 dimming methods are described in the following co-owned patent document: https://patents.google.com/patent/US20170214893A1/en whose disclosure is as mentioned incorporated herein by reference:

"Some or all of the following 3 elements or components can independently be used to control data current to the laser diode, thereby to provide controlled dimming, e.g. as described in detail below:
  a) Laser pixel width
  b) Data Reference DAC gain also termed "Gain A" herein.
  c) Data value division.
  . . . When changing the dimming, typically only data current is varied, whereas threshold current remains constant irrespective of the required dimming level at time t. However, . . . auto threshold current recalibration may be employed, as is conventional. This type of state of the art laser projection system has auto calibration procedures; due to the laser diodes' sensitivity to temperature change, calibration of threshold current and white balance is usually performed automatically with and without dimming".

Regarding the Data Reference DAC Gain method (aka dimming method 2), the above-referenced co-owned patent document describes that:

"Reducing DAC_A gain, aka data reference DAC gain, at the LDR (laser driver) will reduce the reference voltage to Data DAC, increasing the dimming. It is appreciated that "DAC_A gain" is a term used in a particular laser driver specification (the MAX3601). However, any other suitable laser driver may be employed such as the ISL58365 laser driver. The term "DAC_A gain" as used herein refers to any laser driver's parameter which governs the reference voltage of the data DAC (aka color DAC), whereas the term "DAC_B gain" as used herein refers to any laser driver's parameter which governs the reference voltage of the threshold DAC aka base current DAC.

"DAC_A Gain, in conventional laser drivers, is a digital value (8 bit in this example), which by changing its value can reduce DAC_A reference voltage from a maximum value set during a white balance calibration process, down to 1.

"The white balance calibration process is typically executed at the factory site during projection system calibration, and can also be executed (e.g. redone) in the field, in real time or manually, in the course of normal operation to compensate for changes in laser diodes' optical power changes e.g. due to temperature or aging.

"For example, a set of R,G,B laser diodes are found to produce maximum light intensity at a white-balanced image, when the DAC_A Gain setting is 100, 140 and 110 for the R, G and B laser diodes respectively. For maximum dimming, the minimum gain setting of red channel DAC_A can be changed down to 1. Thus the Gain may be reduced by a factor of 100—increasing the dimming ratio by a factor of 100.

"For any given dimming setting—DAC_A Gain is typically reduced for all three color components by the same ratio or, e.g. as described herein, by a triplet of ratios, one per color, suitable for maintaining white balance e.g. if different white balances have been calibrated for each of several intensities of white. However, reducing DAC_A Gain using (say) the same ratio at all three color components may require rounding which may cause deviation from white balance. For example: if at full gain, DAC_A Gain for red is 100 and DAC A Gain for green is 140 and for blue is 110, increasing dimming to 100 will yield DAC_A Gain=100/100=1 for the red, which does not require rounding, but will yield 140/100=1.4 for green and 110/100=1.1 for blue, both of which may require rounding. However, if indeed values rounded to the nearest integer e.g. 1 or 2 are set for the green and blue laser diode's DAC_A Gain respectively, this slightly disturbs the white balance.

"According to certain embodiments, the green and blue DAC A Gain values are (using the above example) rounded up from 1.4 and 1.1 respectively to the closest greater integer which is 2 (typically, to facilitate compensation using a correction factor, the values are rounded up so the correction factor is a number less than or equal to 1). Then, suitable external electronics e.g. ASIC or FPGA that implement the pixel data flow may be used e.g. as shown in FIGS. 1b-3, to multiply each channel pixel value by its correction factor. Continuing with the above example, the green channel pixel data may be multiplied by a correction factor (gain_cf_g) of 1.4/2=0.7 and the blue channel pixel data may be multiplied by a correction factor (gain_cf_B) of 1/1.1=0.909. The controller or CPU may compute Gain A and the gain correction factor for each channel, and load these values to the LDR data reference DAC and to the correction multiplier in the data flow electronics.

All numerical values stipulated appearing herein are of course merely by way of example."

The disclosures of all publications and patent documents mentioned in the specification, and of the publications and patent documents cited therein directly or indirectly, are hereby incorporated by reference other than subject matter disclaimers or disavowals. If the incorporated material is inconsistent with the express disclosure herein, the interpretation is that the express disclosure herein describes certain embodiments, whereas the incorporated material describes other embodiments. Definition/s within the incorporated material may be regarded as one possible definition for the term/s in question.

SUMMARY OF CERTAIN EMBODIMENTS

Certain embodiments seek to provide a laser driver system which emits no light, or less light relative to conventional systems, when generating black pixels. This typically reduces or eliminates the postcard effect and/or improves the contrast ratio and/or reduces power requirements.

Certain embodiments seek to provide a laser driver system in which power consumption is reduced, relative to conventional laser drivers, e.g. by generating zero threshold current for black pixels—which consumes less power than the threshold current generated by conventional laser driver systems. Typically for black pixels, the threshold current consumes less power, at least because the system herein need not generate any threshold current at all, responsive to true black pixel data. In contrast, prior art laser drivers may generate a certain amount of threshold current for all pixels—including those which are black.

Certain embodiments of the present invention seek to provide circuitry typically comprising at least one processor in communication with at least one memory, with instructions stored in such memory executed by the processor to provide functionalities which are described herein in detail. Any functionality described herein may be firmware-implemented or processor-implemented as appropriate.

It is appreciated that any reference herein to, or recitation of, an operation being performed is, e.g. if the operation is performed at least partly in software, intended to include both an embodiment where the operation is performed in its entirety by a server A, and also to include any type of "outsourcing" or "cloud" embodiments in which the operation, or portions thereof, is or are performed by a remote processor P (or several such), which may be deployed off-shore or "on a cloud", and an output of the operation is then communicated to, e.g. over a suitable computer network, and used by, server A. Analogously, the remote processor P may not, itself, perform all of the operation and instead, the remote processor P itself may receive output/s of portion/s of the operation from yet another processor/s P′, may be deployed off-shore relative to P, or "on a cloud", and so forth.

The present invention typically includes at least the following embodiments:

Embodiment 1: A laser system operative in conjunction with a laser diode and a pixel source, the system comprising: at least one laser driver; and/or at least one controller which receives, from the pixel source, black and non-black pixel values each respectively associated with a time interval, each value including at least one color component, and responsively, controls the laser driver to provide, to the laser diode, non-zero current during a first time interval associated with at least one of the non-black pixel values and/or to provide zero current to the laser diode during a second time interval associated with at least one of the black pixel values, thereby to cause the laser diode to project light during the first time interval which is associated with at least one of the non-black pixel values and/or to project no light during the second time interval which is associated with at least one of the black pixel values, yielding a display including non-black regions corresponding to non-black pixel values and true-black regions corresponding to black pixel values.

For black pixels, the color components is typically equal or lower than Black threshold (black_thr) value. The controller may for example comprise the pixel processor or pixel data conversion block according to any of the embodiments shown and described herein.

Embodiment 2. The laser system of any of the preceding embodiments wherein the laser driver includes a first digital-to-analog converter generating a first component of the current, according to pixel data modified by the controller, and a second digital-to-analog converter generating a second component, which is fixed irrespective of pixel data from the controller, and wherein the current provided to the laser diode is a sum of the first and second components.

According to certain embodiments, the controller may receive Data_in from the pixel source and may convert the data_in to Data_out=0, each time Data_in is equal to or lower than a "Black_thr" threshold, so as to control the laser diode to generate zero light projection at a time associated with the data_in value.

Embodiment 3. The laser system of any of the preceding embodiments and wherein gain of the first digital-to-analog converter is calibrated, thereby to achieve white color calibration, when Data_in is not shrunk, by forcing K=1 where K is a shrinking factor by which a Data_in value entering the controller is shrunk each time a Data_in pixel value is above a "black_thr" threshold And the second digital to analog converter is blocked, and generates zero current.

This is used for first digital to analog converter calibration, according to certain embodiments.

Embodiment 4. The laser system of any of the preceding embodiments wherein at least one dimming method is used to provide dimming of light projected by the laser diode.

Embodiment 5. The laser system of any of the preceding embodiments wherein plural dimming methods are used to provide dimming of light projected by the laser diode by plural dimming factors respectively, thereby to achieve total dimming by a total factor which is a product of the plural dimming factors.

Embodiment 6. The laser system of any of the preceding embodiments wherein the controller receives Data_in from the pixel source and converts the Data_in to Data_out, each time Data_in is greater than a threshold, aka Black_thr threshold, by adding a fixed value to a difference between the Data_in and the black_Thr threshold after first shrinking the difference by a shrinking factor of K and rounding.

This fixed value (Channel_Thr register), generates laser threshold current by the LDR channel.

Embodiment 7. The laser system of any of the preceding embodiments wherein the controller receives Data_in from the pixel source and converts the Data_in to Data_out=0, each time Data_in is equal to or lower than a "Black_thr" threshold, thereby to control the laser diode to generate zero light projection at a time associated with the Data_in value.

Embodiment 8. The laser system of any of the preceding embodiments wherein calibration of a Channel_Thr register residing in the controller causes the threshold current to be set by the first digital-to-analog converter instead of by the second digital-to-analog converter which is blocked.

Embodiment 9. The laser system of any of the preceding embodiments wherein, typically, the controller receives Data_in from the pixel source and converts the Data_in to Data_out, each time Data_in is greater than a threshold, aka Black_thr threshold, by adding a fixed value to a difference between the Data_in and the black_Thr threshold after first shrinking the difference by a shrinking factor of K and rounding.

The Channel_Thr register is typically set to the Black_thr threshold, for all laser driver channels, which forces the shrinking factor K to 1 for all channels.

Embodiment 10. A method for operating a laser diode, the method comprising: providing at least one controller which receives, from a pixel source, black and non-black pixel values each respectively associated with a time interval, each value including at least one color component, and/or, responsively, controlling a laser driver to provide, to the laser diode, non-zero current during a first time interval associated with at least one of the non-black pixel values and/or to provide zero current to the laser diode during a second time interval associated with at least one of the black pixel values, thereby to cause the laser diode to project light during the first time interval which is associated with at least one of the non-black pixel values and/or to project no light during the second time interval which is associated with at least one of the black pixel values, yielding a display including non-black regions corresponding to non-black pixel values and true-black regions corresponding to black pixel values.

Embodiment 11. The laser system of any of the preceding embodiments wherein a threshold current for a Data_in value which exceeds a Black_thr threshold by 1, thereby to constitute a lowest Data_in pixel value that generates laser current, is calibrated by adjusting the Channel_Thr register for driving threshold current, to the laser diode via the first digital-to-analog converter.

Embodiment 12. The laser system of any of the preceding embodiments wherein laser response time is reduced, when a non-black pixel appears after a string of black pixels, by predicting occurrence of the non-black pixel at least one clock in advance and, responsively, increasing current provided to the laser diode by a percentage, R, of a threshold current, at least one clock before the non-black pixel occurs.

Embodiment 13. A method according to any of the preceding embodiments wherein a shrinking factor K is used to scale a Data_in range above a black_thr value, to a Data_out range above a Channel_Thr value.

Embodiment 14. A method according to any of the preceding embodiments wherein the shrinking factor K is computed by dividing a difference between Data_max the maximum data_in value, and Channel Thr by a difference between Data_max and a black_thr value.

Embodiment 15. The laser system of any of the preceding embodiments wherein the pixel source comprises a buffer such as a display buffer.

Embodiment 16. The laser system of any of the preceding embodiments wherein the pixel source comprises a pixel generator.

Embodiment 17. The laser system of any of the preceding embodiments wherein the at least one driver comprises plural laser drivers corresponding to plural color component channels.

Embodiment 18. A method according to any of the preceding embodiments which is configured to predict at least one Blk pixel string including at least one black pixels.

Also provided, excluding signals, is a computer program comprising computer program code means for performing any of the methods shown and described herein when the program is run on at least one computer; and a computer program product, comprising a typically non-transitory computer-usable or -readable medium e.g. non-transitory computer-usable or -readable storage medium, typically tangible, having a computer readable program code embodied therein, the computer readable program code adapted to be executed to implement any or all of the methods shown and described herein. The operations in accordance with the teachings herein may be performed by at least one computer specially constructed for the desired purposes or general purpose computer specially configured for the desired purpose by at least one computer program stored in a typically non-transitory computer readable storage medium. The term "non-transitory" is used herein to exclude transitory, propagating signals or waves, but to otherwise include any volatile or non-volatile computer memory technology suitable to the application.

Any suitable processor/s, display and input means may be used to process, display e.g. on a computer screen or other computer output device, store, and accept information such as information used by or generated by any of the methods and apparatus shown and described herein; the above processor/s, display and input means including computer programs, in accordance with all or any subset of the embodiments of the present invention. Any or all functionalities of the invention shown and described herein, such as but not limited to operations within flowcharts, may be performed by any one or more of: at least one conventional personal computer processor, workstation or other programmable device or computer or electronic computing device or processor, either general-purpose or specifically constructed, used for processing; a computer display screen and/or printer and/or speaker for displaying; machine-readable memory such as flash drives, optical disks, CDROMs, DVDs, BluRays, magnetic-optical discs or other discs; RAMs, ROMs, EPROMs, EEPROMs, magnetic or optical or other cards, for storing, and keyboard or mouse for accepting. Modules illustrated and described herein may include any one or combination or plurality of: a server, a data processor, a memory/computer storage, a communication interface (wireless (e.g. BLE) or wired (e.g. USB)), a computer program stored in memory/computer storage.

The term "process" as used above is intended to include any type of computation or manipulation or transformation of data represented as physical, e.g. electronic, phenomena which may occur or reside e.g. within registers and/or memories of at least one computer or processor. Use of nouns in singular form is not intended to be limiting; thus the term processor is intended to include a plurality of processing units which may be distributed or remote, the term server is intended to include plural typically interconnected modules running on plural respective servers, and so forth.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements all or any subset of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention. Any of the teachings incorporated herein may wherever suitable operate on signals representative of physical objects or substances.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless stated otherwise, terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining", "providing", "accessing", "setting" or the like, refer to the action and/or processes of at least one computer/s or computing system/s, or processor/s or similar electronic computing device/s or circuitry, that manipulate and/or transform data which may be represented as physical, such as electronic, quantities e.g. within the computing system's registers and/or memories, and/or may be provided on-the-fly, into other data which may be similarly represented as physical quantities within the computing system's memories, registers or other such information storage, transmission or display devices or may be provided to external factors e.g. via a suitable data network. The term "computer" should be broadly construed to cover any kind of electronic device with data processing capabilities, including, by way of non-limiting example, personal computers, servers, embedded cores, computing system, communication devices, processors (e.g. digital signal processor (DSP), microcontrollers, field programmable gate array (FPGA), application specific integrated circuit (ASIC), etc.) and other electronic computing devices. Any reference to a computer, controller or processor is intended to include one or more hardware devices e.g. chips, which may be co-located or remote from one another. Any controller or processor may for example comprise at least one CPU, DSP, FPGA or ASIC, suitably configured in accordance with the logic and functionalities described herein.

Any feature or logic or functionality described herein may be implemented by processor/s or controller/s configured as per the described feature or logic or functionality, even if the processor/s or controller/s are not specifically illustrated for simplicity. The controller or processor may be implemented in hardware, e.g., using one or more Application-Specific Integrated Circuits (ASICs) or Field-Programmable Gate Arrays (FPGAs) or may comprise a microprocessor that runs suitable software, or a combination of hardware and software elements.

The present invention may be described, merely for clarity, in terms of terminology specific to, or references to, particular programming languages, operating systems, browsers, system versions, individual products, protocols and the like. It will be appreciated that this terminology or such reference/s is intended to convey general principles of operation clearly and briefly, by way of example, and is not intended to limit the scope of the invention solely to a particular programming language, operating system, browser, system version, or individual product or protocol. Nonetheless, the disclosure of the standard or other professional literature defining the programming language, operating system, browser, system version, or individual product or protocol in question, is incorporated by reference herein in its entirety.

Elements separately listed herein need not be distinct components and alternatively may be the same structure. A statement that an element or feature may exist is intended to include (a) embodiments in which the element or feature exists; (b) embodiments in which the element or feature does not exist; and (c) embodiments in which the element or feature exist selectably e.g. a user may configure or select whether the element or feature does or does not exist.

Any suitable input device, such as but not limited to a sensor, may be used to generate or otherwise provide information received by the apparatus and methods shown and described herein. Any suitable output device or display may be used to display or output information generated by the apparatus and methods shown and described herein. Any suitable processor/s may be employed to compute or generate or route, or otherwise manipulate or process information as described herein and/or to perform functionalities described herein and/or to implement any engine, interface or other system illustrated or described herein. Any suitable computerized data storage e.g. computer memory may be used to store information received by or generated by the systems shown and described herein. Functionalities shown and described herein may be divided between a server computer and a plurality of client computers. These or any other computerized components shown and described herein may communicate between themselves via a suitable computer network.

The system shown and described herein may include user interface/s e.g. as described herein which may for example include all or any subset of: an interactive voice response interface, automated response tool, speech-to-text transcription system, automated digital or electronic interface having interactive visual components, web portal, visual interface loaded as web page/s or screen/s from server/s via communication network/s to a web browser or other application downloaded onto a user's device, automated speech-to-text conversion tool, including a front-end interface portion thereof and back-end logic interacting therewith. Thus the term user interface or "UI" as used herein includes also the underlying logic which controls the data presented to the user e.g. by the system display and receives and processes and/or provides to other modules herein, data entered by a user e.g. using her or his workstation/device.

BRIEF DESCRIPTION OF THE DRAWINGS

Certain embodiments of the present invention are illustrated in the following drawings; in the block diagrams, arrows between modules may be implemented as APIs and any suitable technology may be used for interconnecting functional components or modules illustrated herein in a suitable sequence or order e.g. via a suitable API/Interface. For example, state of the art tools may be employed, such as but not limited to Apache Thrift and Avro which provide remote call support. Or, a standard communication protocol may be employed, such as but not limited to HTTP or MQTT, and may be combined with a standard data format, such as but not limited to JSON or XML. According to one embodiment, one of the modules may share a secure API with another. Communication between modules may comply with any customized protocol or customized query language or may comply with any conventional query language or protocol.

FIGS. 5 and 7 are simplified flowchart illustrations of methods according to certain embodiments; these methods typically comprise all or any subset of the illustrated operations, suitably ordered e.g. as shown.

Figure 1:
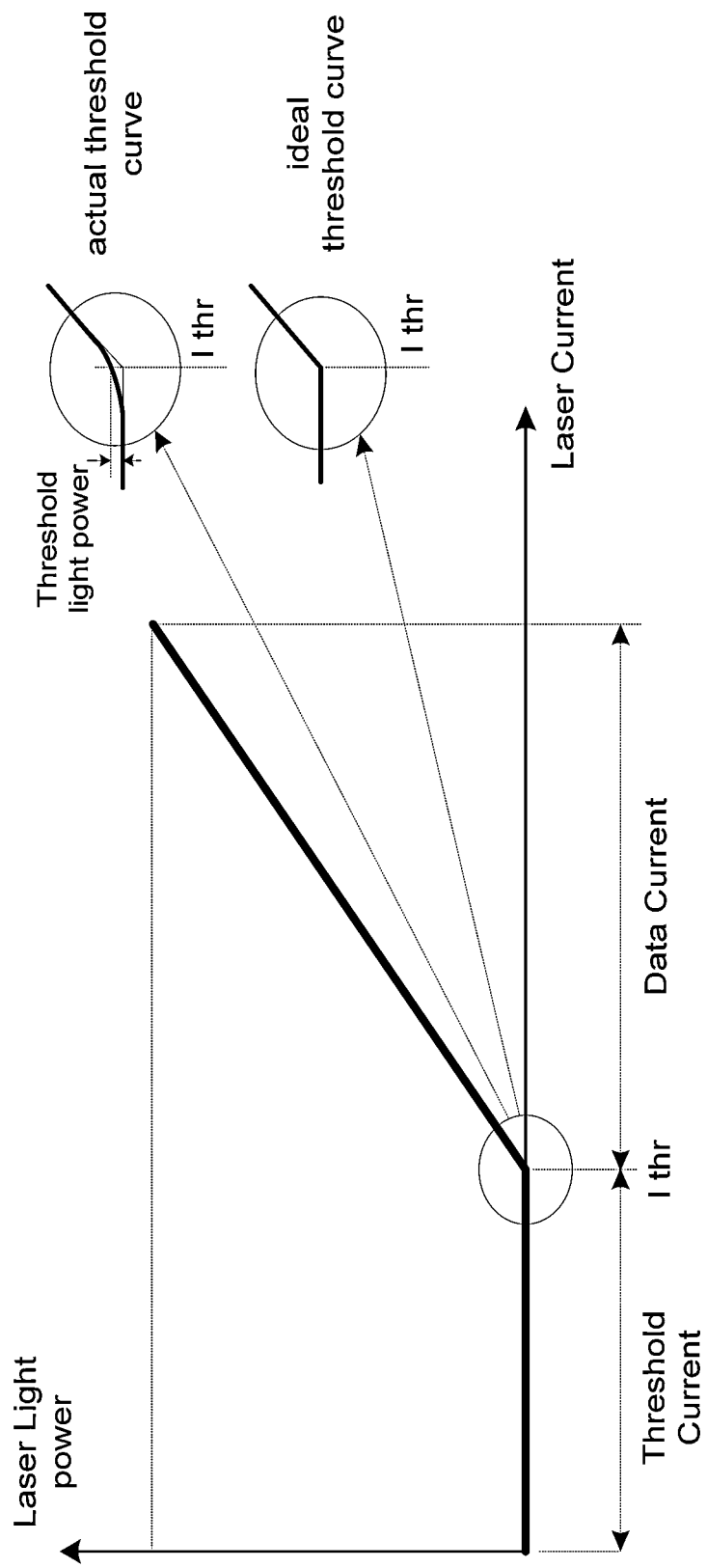
FIG. 1 is a graph helpful in understanding certain embodiments.

Methods and systems included in the scope of the present invention may include any subset or all of the functional blocks shown in the specifically illustrated implementations by way of example, in any suitable order e.g. as shown. Flows may include all or any subset of the illustrated operations, suitably ordered e.g. as shown. Tables herein may include all or any subset of the fields and/or records and/or cells and/or rows and/or columns described.

In the swim-lane diagrams, it is appreciated that any order of the operations shown may be employed rather than the order shown, however preferably, the order is such as to allow utilization of results of certain operations by other operations by performing the former before the latter, as shown in the diagram.

Computational, functional or logical components described and illustrated herein can be implemented in various forms, for example, as hardware circuits such as but not limited to custom VLSI circuits or gate arrays or programmable hardware devices such as but not limited to FPGAs, or as software program code stored on at least one tangible or intangible computer readable medium and executable by at least one processor, or any suitable combination thereof. A specific functional component may be formed by one particular sequence of software code, or by a plurality of such, which collectively act or behave or act as described herein with reference to the functional component in question. For example, the component may be distributed over several code sequences such as but not limited to objects, procedures, functions, routines and programs and may originate from several computer files which typically operate synergistically.

Each functionality or method herein may be implemented in software (E.g. for execution on suitable processing hardware such as a microprocessor or digital signal processor), firmware, hardware (using any conventional hardware technology such as Integrated Circuit technology) or any combination thereof.

Functionality or operations stipulated as being software-implemented may alternatively be wholly or fully implemented by an equivalent hardware or firmware module and vice-versa. Firmware implementing functionality described herein, if provided, may be held in any suitable memory device and a suitable processing unit (aka processor) may be configured for executing firmware code. Alternatively, certain embodiments described herein may be implemented partly or exclusively in hardware in which case all or any subset of the variables, parameters, and computations described herein may be in hardware.

Any module or functionality described herein may comprise a suitably configured hardware component or circuitry. Alternatively or in addition, modules or functionality described herein may be performed by a general purpose computer or more generally by a suitable microprocessor, configured in accordance with: methods shown and described herein, or any suitable subset, in any suitable order, of the operations included in such methods, or in accordance with methods known in the art.

Any logical functionality described herein may be implemented as a real time application if and as appropriate and which may employ any suitable architectural option such as but not limited to FPGA, ASIC or DSP or any suitable combination thereof.

Any hardware component mentioned herein may in fact include either one or more hardware devices e.g. chips, which may be co-located or remote from one another.

Any method described herein is intended to include within the scope of the embodiments of the present invention also any software or computer program performing all or any subset of the method's operations, including a mobile application, platform or operating system e.g. as stored in a medium, as well as combining the computer program with a hardware device to perform all or any subset of the operations of the method.

Data can be stored on one or more tangible or intangible computer readable media stored at one or more different locations, different network nodes or different storage devices at a single node or location.

It is appreciated that any computer data storage technology, including any type of storage or memory and any type of computer components and recording media that retain digital data used for computing for an interval of time, and any type of information retention technology, may be used to store the various data provided and employed herein. Suitable computer data storage or information retention apparatus may include apparatus which is primary, secondary, tertiary or off-line; which is of any type or level or amount or category of volatility, differentiation, mutability, accessibility, addressability, capacity, performance and energy use; and which is based on any suitable technologies such as semiconductor, magnetic, optical, paper and others.

DETAILED DESCRIPTION OF CERTAIN EMBODIMENTS

The following terms may be construed either in accordance with any definition thereof appearing in the prior art literature or in accordance with the specification, or to include in their respective scopes, the following:

The term "laser driver" is used herein to include any device which receives pixel data and, accordingly, generates a current aka output current, laser current or output laser current, to drive a laser diode thereby driving the laser diode to generate a visual presentation which represents the pixel data to, typically, a human end-user. An example of a commercially available laser driver is Renesas ISL78365 quad laser diode driver.

Typically, the laser current $I\_laser$ includes two current components: a constant current value aka threshold current and a variable (e.g. over time) current value that is based on e.g. is an ascending function of e.g. is proportional to the pixel data.

Using I to denote current, $I\_laser$ denotes laser current. $I\_thr$ denotes threshold current, $I\_color$ denotes data current, or current proportional to pixel data, and Laser current, $I\_laser$, equals the sum of laser threshold current and laser data current.

Figure 2:
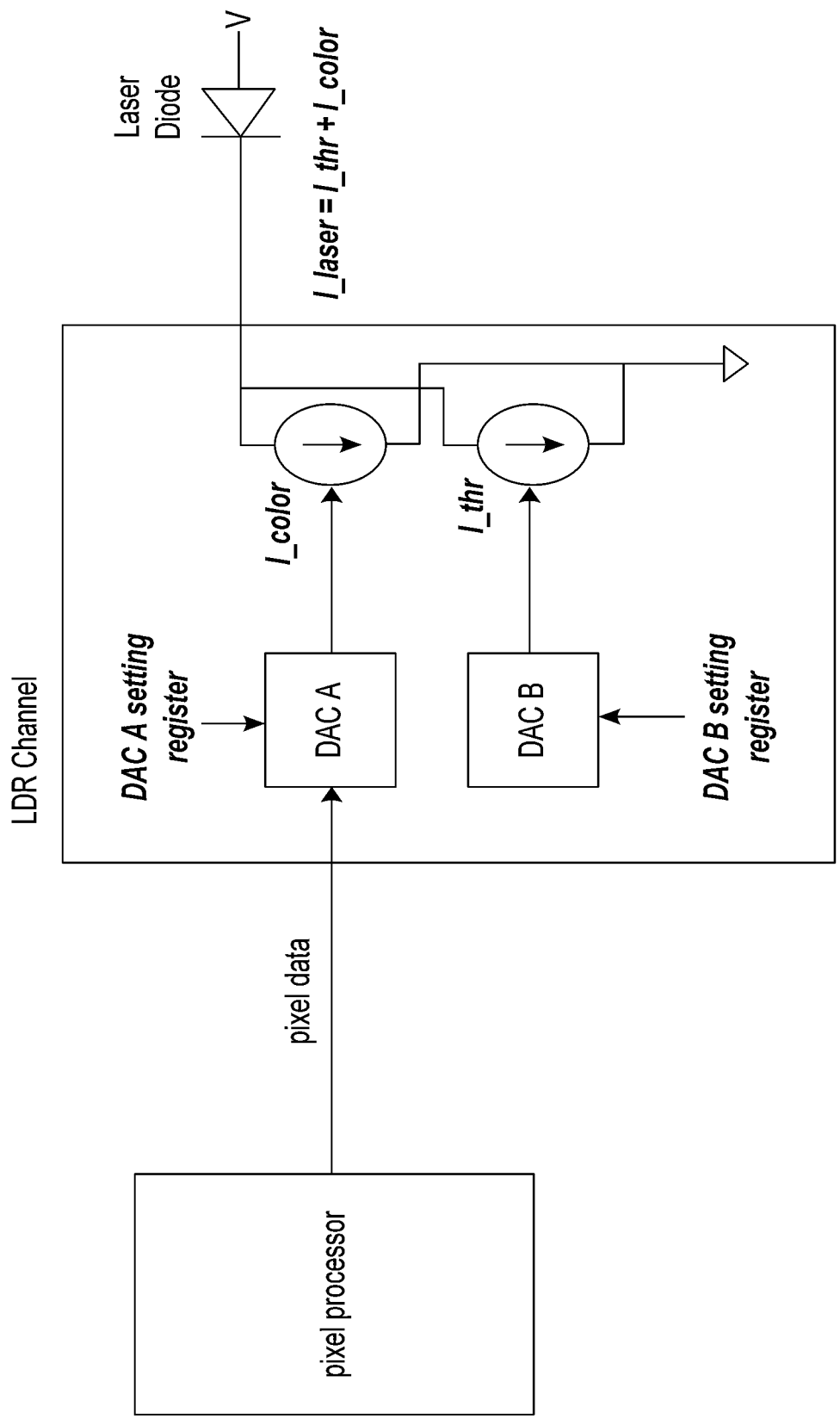
FIGS. 2-4 are simplified block diagram illustrations of apparatus constructed and operative in accordance with certain embodiments.

The term "pixel processor" (e.g. as shown in FIG. 2) Is intended to include any hardware which sends a stream of pixels, according to a given timing, to a laser driver. The pixel processor in FIG. 2 is the pixel stream source e.g. from the display buffer or any other pixel source. The hardware may comprise a hardware processor which generate pixels, or modifies pixels generated by an external source such as a display buffer, and/or may comprise a communication channel that receives a pixel stream from an external source such as, say, a laptop or mobile phone etc.

The following terms may according to certain embodiments be used interchangeably and may be used to refer to a non-black pixel whose value is generated by the pixel processor: yellow pixel, projected pixel (e.g. in FIG. 6), and data pixel.

It is appreciated that a threshold pixel may also be non-black, and may be generated by methods shown and described herein rather than by the pixel processor.

A pixel driven by threshold current is considered a black pixel in conventional laser driver system. Herein, a "threshold pixel" typically comprises a pixel driven by Threshold current.

In conventional laser driver (LDR) systems each laser current typically comprises a sum of two separate current components: Threshold current and Data current (also called pixel current, or color current).

The threshold current is, according to certain embodiments, a fixed value (for a given channel) once it is set; the threshold current value may for example be controlled by a register in the laser driver. This register value may be determined during white balance (WB) calibration to assure black projection when pixel data is zero.

Ideally the graph of laser light power versus laser current would have a sharp corner at threshold current. But in reality—some minimal light is typically projected at the threshold current, which will generate some light at black pixels and will reduce the contrast ratio.

In conventional laser drivers, the threshold current is typically fixed during the active display region, e.g. As generated by the laser driver. The pixel value generates variable current proportional to the pixel data. Thus threshold current is constantly consumed, even for black pixels.

According to embodiments described herein, threshold current value is added to the pixel data value to generate the variable current. For black pixels variable current is forced to zero (zero current) such that no current is consumed for black pixels.

A system is now described which, given a string of N desirably black pixels followed by desirably non-black pixels, projects less than N (typically N−1) pixels with a pixel value of zero, followed by a pixel (or sub pixel) whose current value is R×thr, followed by the non-black pixels.

FIG. 1 graphs the ideal versus actual laser light power curve at the threshold current region.

The Data current is determined by the pixel data generated at the pixel source generator. This pixel source generator can be realized by a logic circuit or any type of processor, for example—an FPGA. The Data current is determined by the pixel data value from the FPGA and the amplifier gain at the laser driver (LDR). This gain is typically determined during white balance (WB) calibration.

The actual curve at the data current region is not exactly linear; the linearity is an approximation.

Reference is now made to FIG. 2 which shows a typical laser driver (LDR) system.

Pixel data is the pixel color component data generated by the pixel processor or any processing logic. This pixel data is sent to laser driver (LDR) channel's Digital to Analog Converter A that converts pixel data to I_color current. A DAC A setting register sets the gain of a DAC A amplifier, which control I_color current. A DAC B in the laser driver channel generates the threshold current I_thr according to a DAC B setting register.

It is appreciated that the two registers are denoted by A and B simply to distinguish there between by using the first 2 letters of the alphabet; the B register does not correspond to the Blue channel, if RGB channels are provided.

The Digital to Analog Converter B setting is calibrated, e.g. during a white balance process, to generate black level laser power for black pixels, and the Digital to Analog Converter A setting is calibrated to generate a required (typically as per a one time in-factory calibration) maximum laser power for maximum pixel data value. For RGB projection, the Digital to Analog Converter A setting of each laser driver (LDR) channel may be calibrated for white color.

Calibration of Digital to Analog Converter A gain, to yield a user maximum laser light power requirement, may be performed off-line during system calibration, or on-line periodically or on any suitable occasion e.g. when re-calibration is desirable or required such as for the purposes of periodical or continuous white balance calibration. For RGB projection all three color components are typically calibrated together for maximum white light power requirements. This calibration typically does not involve the pixel processor and instead includes generating a calibration pixel value and measuring the light brightness color and intensity.

During normal operation e.g. subsequent to completion of the White Balancing or white balance calibration process, the Threshold current is active (e.g. non-zero) during all active lines within the projection active region. This means that the threshold current is also active for black pixels inside the active region.

Figure 3:
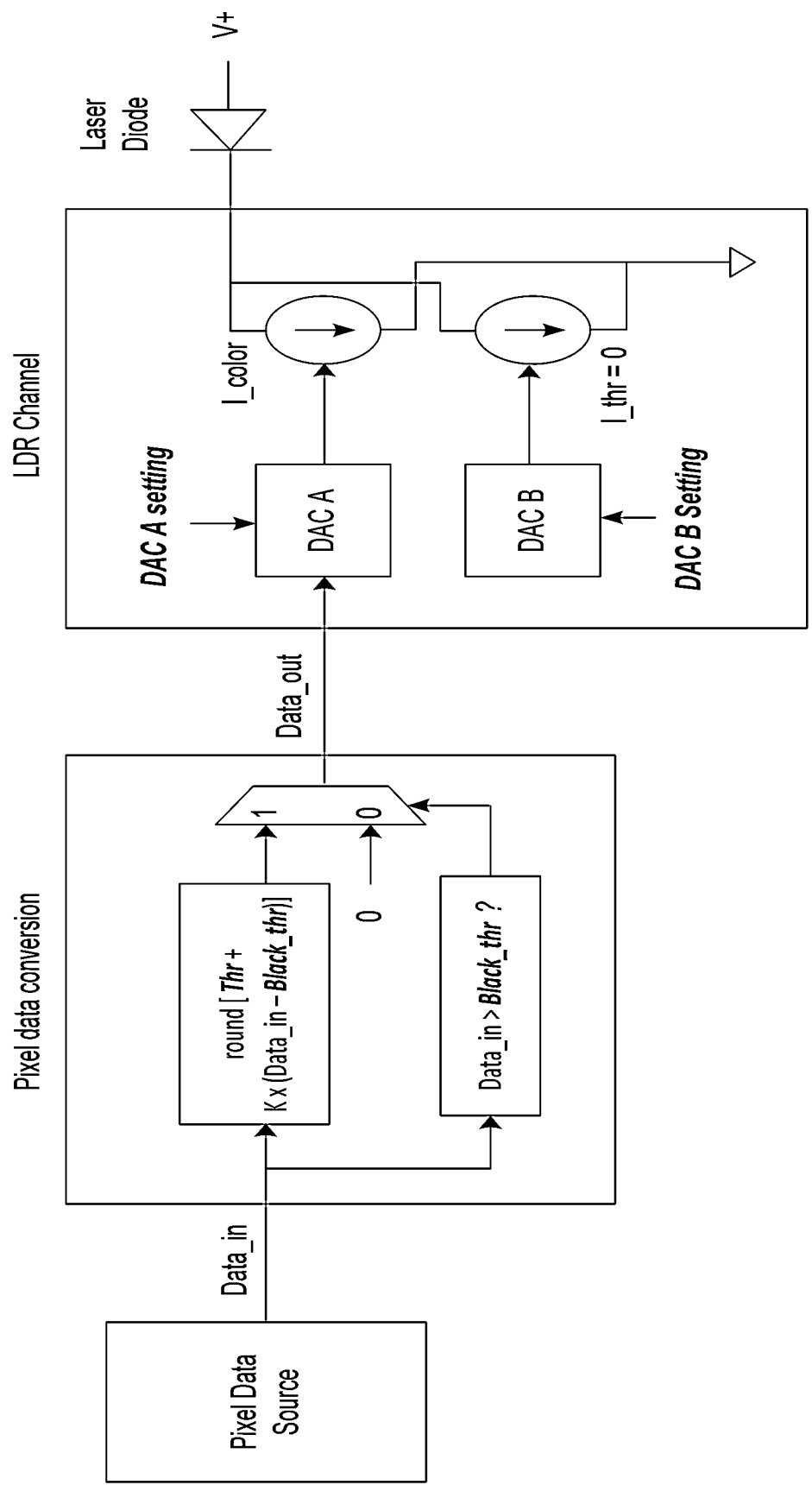

There may be two drawbacks to drive threshold current during entire active lines. First, black pixels may still project minimal light, reducing contrast ratio, and/or, e.g. secondly, there may be wastage of un-necessary power for zero pixels According to certain embodiments a Smart Laser drive is provided, e.g. as shown in FIG. 3 (and in FIG. 4), in which threshold current drops to zero (zero current) for black pixels. This has the advantage of both enhancing user experience by generating absolute zero projection light power for black pixels (true black) and also, reducing power consumption of the device, by saving the power that, conventionally, is devoted to generating unwarranted non-zero projection light power for black pixels.

Pixels may be defined as "black" if their pixel value is equal to or below a black level threshold (black_thr).

The threshold current source in the laser driver (LDR) may be blocked (I_thr=0, e.g. by blocking Digital to Analog Converter B).

In FIG. 3, for example, Data_in may be assumed to be the pixel data value for a given laser driver channel. For each laser driver (LDR) channel, the pixel data to the laser driver (LDR) channel may be modified to include the threshold value added to pixel data (Data_in) after shrinking. The result value will accommodate both threshold and pixel data values to laser driver (LDR)'s Digital to Analog Converter A. Typically, this pixel data shrinking, which occurs in the pixel data conversion sub block of FIG. 3, will only slightly reduce Data_in resolution.

The shrinking factor (e.g. K in FIG. 3) is typically proportional to:

1−(Laser diode Threshold current/Laser diode Max current)

This ratio depends on laser diode parameters.

Typically, the Laser diode Threshold current/Laser diode Max current range ratio is 0.2 to 0.5, therefore the shrinking factor range is 0.5 to 0.8.

As shown in the graph of FIG. 3, resolution reduction is determined by parameter K. for example, if K=0.5, the resolution is reduced by about 1 bit (from 10 bits to 9 bits) whereas if K=0.25 the resolution is reduced by about 0.5 bit (from 10 bits to 9.5 bits). it is appreciated that resolution reduction artifacts can be eliminated or reduced by dithering.

The following computation may be used to shrink a Data_in value by a shrinking factor of K, each time the data_in pixel value is above black_thr:

To generate Data_out to the laser driver (LDR) from Data_in, the system may compute:

IF Data_in >Black_thr THEN

Data_out=round[Channel_Thr+K×(Data_in−Black_thr)]

ELSE

Data_out=0

Where round [Channel_Thr+K×(Data_in−Black_thr)] may be the value of projected non-black pixels.

It is appreciated that multiplying K by (Data_in−Black_thr) yields an integer plus a fraction. To enable the output pixel to be an integer, the fraction may either be eliminated or may be used in a dithering or rounding process where dithering typically produces better results. Thus, according to an embodiment, the rounding function may be replaced with a temporal or spatial dither function to reduce artifacts of shrinking the dynamic range of Data_in by a factor of K, e.g.:

$$K=(Data\_max-Thr)/(Data\_max-Black\_thr)$$

The following define what the above terms may represent:

Data_max is the maximum value for pixel data e.g. as shown in the graph included in FIG. 3. Data_max may for example be 1023, for a 10 bit pixel component value K is the shrinking factor of the Data_in range. Value presentation may be 1.12 (1 bit integer, 12 bit fraction) K is typically determined once after calibration (operation 520 in FIG. 5), when Thr value is found.

Channel_Thr (aka "Thr")=threshold value per-channel such that typically, Thr has a different value for each laser driver (LDR) channel. Typically proportional to threshold current. Range may for example be 0 . . . 1023, for a 10 bit pixel component value. This threshold value when sent to Digital to Analog Converter A (say) of the laser driver produces threshold current for the laser connected to that channel.

Data_in=Pixel data. Range may be 0 . . . 1023

Black_thr=Black pixel threshold value. Range may be 0 . . . 63 (for 6 bit resolution).

Typically this refers to the largest pixel value generated by the pixel processor, which is still represented by zero-power projection (by not projecting any power).

Data_out=Data out to the laser driver (LDR) channel. Range may be 0 . . . 1023

In the above definitions, all values are presented, by way of example, assuming 10 bit resolution of Data_in and of Data_out and assuming that the Digital to Analog Converter A resolution is the same as the Data_out resolution. However—any other resolution/s can be used instead.

Figure 4:
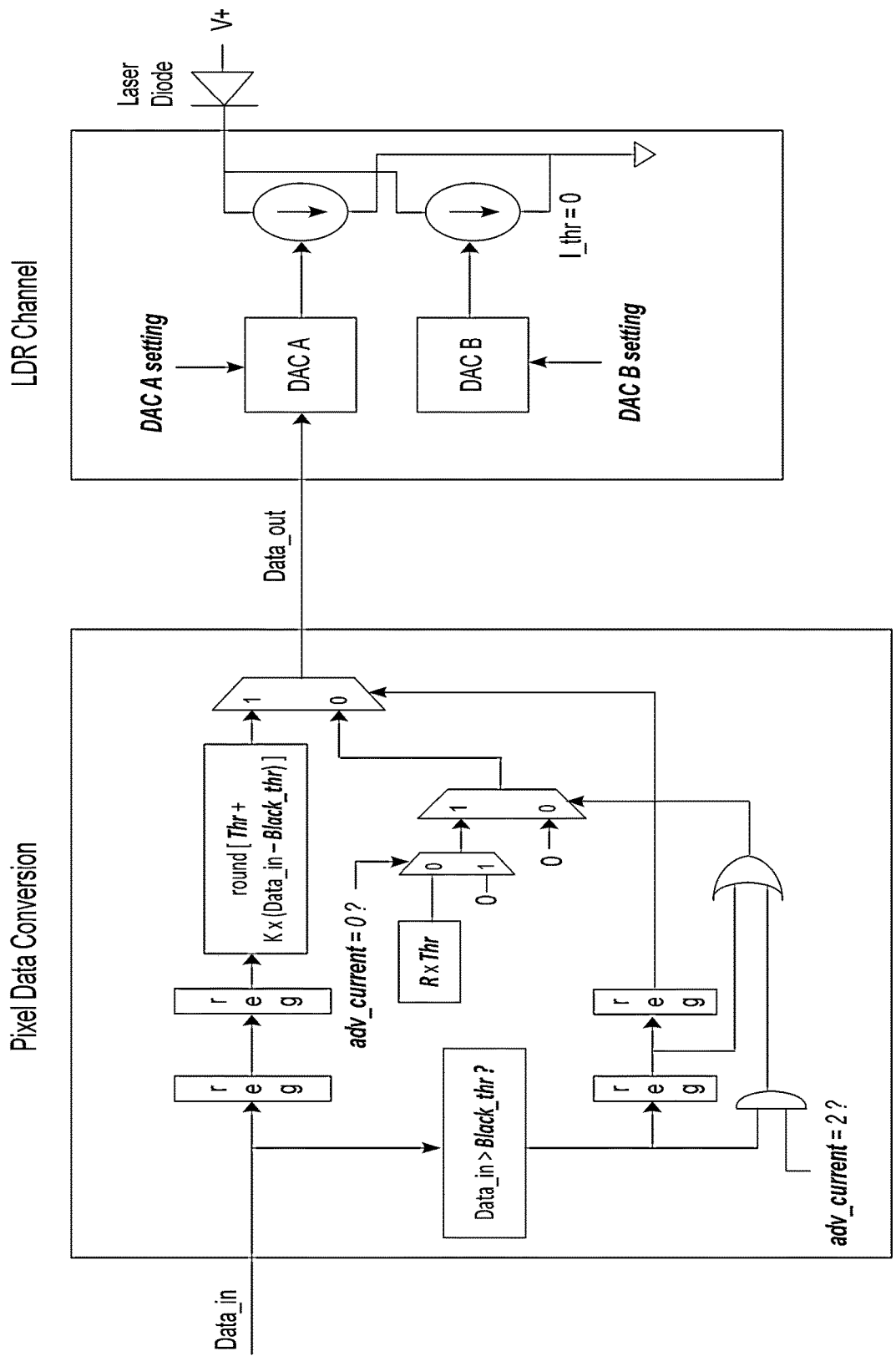

The pixel data conversion block which may perform any or all of the above computations may be positioned just before (upstream of) each laser driver (LDR) channel e.g. as shown in FIGS. 3, 4 herein. For each channel the Channel_Thr value and Digital to Analog Converter A setting is typically calibrated separately whereas typically, the Black threshold is identical to all channels.

Thus FIG. 3 illustrates a system and method which generates projection of pixels using a standard laser driver, however, without constant threshold current being provided by Digital to Analog Converter B. Threshold current is generated by Digital to Analog Converter A and the threshold current is typically added to Pixel Data provided e.g. by a pixel processor. The system and method of FIG. 3 converts pixel data into data which is fed to the DAC A which, responsively, generates threshold current to be added to the pixel data.

For color projection, each pixel comprises plural e.g. three color components (for example: R,G,B). according to certain embodiments, each such color component typically passes through a pixel data conversion block such as that of FIG. 3, to generate Data_out which is fed to the laser driver (LDR) channel corresponding to that color component. Data_in is thus a color component pixel value which may for example be provided by any pixel processor, and Data_out is a color component value to be sent to a corresponding laser driver (LDR) channel. FIG. 3 shows a pixel conversion block that generates this data_out to the laser driver (LDR) channel from a pixel data component (data_in) and a threshold level register (Thr). The logic of the pixel data conversion block in FIG. 3 typically effects conversion of Data_in to Data_out, each time Data_in is greater than Black_thr, by adding the Channel_Thr (aka "Thr") value to the difference between data_in and black_Thr after first shrinking that difference by a factor of K, then rounding. When Data_in is equal to or lower than Black_thr, Data_out is 0, for no light projection.

Ithr in FIGS. 1 and 2 denotes a "threshold" current through the laser diode because ideally, any current above this level generates light (x case), whereas any current below this threshold level or value does not generate light (y case) hence results in black (=no light). thus for a black pixel in an ideal laser diode (see e.g. FIG. 2) I_color=0, the current through the laser diode is Ithr, and the laser diode does not inject light at all.

Since the actual laser diode is not ideal, the diode actually generates some light even if driven by Ithr current (see e.g. FIG. 1). Therefore when an actual laser diode is driven e.g. as shown in FIG. 2 the ostensible black pixel (a pixel that generate Icolor=0 in FIG. 2) does not appear black at all because some light is injected from the laser diode even when driven by Ithr.

In contrast, certain embodiments herein generate a truly black (true black) pixel using an actual, non-ideal laser diode. Thus when provided with pixel data considered black—the laser diode generates no light at all, according to certain embodiments.

A pixel is considered black when its pixel data value (Data_in in FIG. 3) is less than or equal to a Black_thr value aka "Black threshold". Thus for pixel data equal to or below Black_thr, no light is generated, according to certain embodiments, whereas when pixel data is above Black_thr, light is generated according to the pixel data value According to certain embodiments, a "Thr" register (aka "threshold level register") is used to compute pixel data_out to the laser driver (LDR) from pixel data in (e.g. as shown in FIG. 3). Each LDR channel typically has its own Thr register (For example: R_Thr for red channel, G_Thr for green channel, B_Thr for blue channel), therefore a "threshold level register" is also termed a channel_Thr register herein.

FIG. 5 is a simplified flow of a Calibration procedure. According to certain embodiments, the calibration procedure of FIG. 5 is performed on first system setup (i.e., factory setting) e.g. only once. Alternatively or in addition, calibration may be performed in the field assuming existence of light sensing.

Operations 510 and 520 may be performed either manually or automatically.

Typically, operations 510 and 520 in the calibration flow of FIG. 5 achieve white balance, inter alia.

Typically, in operation 510, Digital to Analog Converter A's gain is calibrated or set; this allows the black level in operation 520 to be adjusted by setting the thr register, Typically, operation 510 calibrates white color whereas operation 520 calibrates black level.

Then, operation 530 may be performed if dimming is required, e.g. by using the laser driver's Digital to Analog Converter A gain.

Operation 510 (Adjust color gain (DAC A setting)) may, according to certain embodiments, comprise:

Set Channel_Thr register=Black_thr for all laser driver (LDR) channels. This setting forces K=1 for all channels; and/or Adjust brightness by setting Data_in=Data_max, and adjust DAC A setting for maximum required brightness (e.g. the maximum white color brightness required by the user which may, for example, be defined via an API). For RGB projection, set all three pixel data_in components to Data_max and adjust Digital to Analog Converter A's setting, in of each laser driver (LDR) channel, to maximum required white brightness. It is also possible to set Data_in that is lower than Data_max, for example 75% of Data_max, and/or to adjust LDR Digital to Analog converter A setting to a gray level that is 75% (say) of Max brightness level.

Operation 520 (Adjust threshold (Thr register setting)) may, according to certain embodiments, comprise adjusting threshold current for Data_in=maximum black pixel value+1 (Data_in=Black_Thr+1) by adjusting Channel_Thr register to achieve the required (e.g. acceptable) black level.

For Data_in=<Black_thr, Data_out typically will be 0, causing laser current I_laser to be 0, projecting no light (Absolute black or true black). The lowest Data_in pixel value that generates laser current will be Black_thr+1, and for this value the Channel_Thr register for driving threshold current to the laser diode may be calibrated by adjusting Channel_Thr register.

It is appreciated that the calibration of channel_thr register sets the threshold current by Digital to Analog Converter A instead of Digital to Analog Converter B which is blocked. During Channel_Thr register calibration the shrinking parameter K may be computed anew. This sets the shrinking parameter K to a final calibrated value.

According to certain embodiments, the laser diode thus shifts from full off to full on, when the desired pixel string shifts from black to Data_Max value. Physically, the transition time from off to on is non-zero whereas desirably, the transition time is a close as possible to zero. According to certain embodiments, the system can estimates, in advance, whether or not to generate a threshold pixel so as to reduce the transition time of the laser diode from off to full on.

FIG. 4 is an optional improvement of the system of FIG. 3.

Specifically, the system and method of FIG. 4 is an embodiment which, relative to the embodiment of FIG. 3, speeds up laser response time, e.g. by decreasing the transition time, from laser-off to laser-on, on occasions in which, after a string or period of black pixels, a non-black pixel appears. In the embodiment of FIG. 4, occurrence of this non-zero (non-black) pixel is predicted in advance. The laser response time may be improved by adding, one or two (say) clocks in advance (e.g. one or two clocks (say) before the non black pixel), some percentage, R, of the threshold value. Thus the system may drive threshold current, or some fraction or percentage R thereof. This percentage R may be any number equal or lower than 100%, and may be set in-factory at a value which is found, by trial and error, to speed up laser response time And/or to achieve a desired level of contrast ratio between a given information pixel and a pixel preceding the given information pixel.

As shown in FIG. 4, the system may according to certain embodiments and/or according to certain operating modes, e.g. to improve laser rise time due to laser current I_laser starting from 0 mA, examine each pixel in advance, say 1 or 2 clocks ahead of the next non-black pixel, and turn on the full Channel_Thr level or some percentage, R=<1, of the Channel_Thr level (R*Channel_Thr) before the actual pixel projection is required (e.g. when Data_in >Black_thr indicating non-black pixels which, unlike black pixels, require projection). This is advantageous when there is a string of black pixels (which do not require projection) followed by non black pixels which do require projection).

In FIG. 4, by way of example, each pixel in the pixel data may be examined one or two clocks in advance (e.g. one or two clocks (say) before the non black pixel). It is appreciated that the question of how many clocks in advance should each pixel in the pixel data be examined may depend on the response time of the laser (for generating light) from 0 current to required current. In the example of FIG. 4, a flexible solution is shown which allows pixels' data to be examined either zero or one or two clocks in advance (e.g. zero or one or two clocks (say) before the non black pixel), but this is not intended to be limiting. This flexibility may be advantageous, even when the laser response time is a fixed parameter for a given laser e.g. because each laser may have a different response time, and/or because response time may depend not only on the laser but also on wiring inductance and/or because the Clock rate may be different for different applications.

If the pixel data value is above Black_Thr, the Data_out is typically forced to R*Thr for a period of (say) one/two clocks in advance, when R is a parameter value lower than or equal to 1. R parameter may be defined (e.g. in-factory) according to laser response time as a function of the laser's initial current.

R may be set, e.g. in factory, e.g. according to contrast ratio requirements of the system, to improve the response time of the laser diode e.g. in transiting from black to a non-black pixel.

R (a value between 0 and 1) is typically defined according to required response time since a (higher R yields lower response time) and according to black projected light at R*Thr since higher R yields more light at the black pixel. For example, in some use-cases, response time may be more important than the amount of light in the black pixels, thus a trial and error process, may be used, typically in-factory, to find the highest acceptable response time and a value for R may then be determined, which yields that highest acceptable response time, e.g. by trial and error.

In other use-cases, rapid response time may be less important than reducing the amount of light in the black pixels, in which case a trial and error process, e.g. in-factory, may be employed to determine the highest acceptable amount of light in the black pixels and a value for R may be determined which yields that highest acceptable value, e.g. by trial and error.

Bold italics are used to denote parameters which, according to certain embodiments, are controlled by the user. typically these parameters are stored in registers. Typically, these are registers that a user can write and control.

The Adv_current parameter may for example be:
0: no advance of threshold (advance threshold by 0 clocks)
1: advance threshold (in Channel_Thr register) by 1 clock
2: advance threshold (in Channel_Thr register) by 2 clocks In the example of FIG. 4, four registers are provided, which allows the system to estimate, 1-2 clocks in advance, whether or not to generate current in advance.

Typically, the top two registers hold input pixel values for two clocks respectively. The lower two registers hold two respective non-black pixel values which have been detected in advance (when Data_in >Black_thr). When a non-black pixel value is detected, the detection propagates to a multiplexer that selects the data_out for black pixels to be R×Thr register instead of 0 (which is selected if the detected pixel is black). Propagation is two registers for detection 2 clocks in advance, and one register for detection 1 clock in advance.

Thus, e.g. as described above, the pixel data conversion in the embodiment of FIGS. 3 and 4 typically converts a pixel data stream (data_in) sent by the display buffer (or other pixel source) to a stream of values (data_out) that are proportional to a desired laser diode current, so DAC A will convert the data_out values to current to drive the laser diode while DAC B is blocked; typically black pixels the data_out value is 0 (for zero light projection), whereas for non black pixels the data_out value is a sum of threshold current level and pixel data current level.

It is appreciated that any number of laser diode channels may be employed e.g. a single channel for a single laser driver, or 3 channels for 3 laser drivers (R,G,B). given N channels, the apparatus of FIGS. 3-4 may be provided N times over.

Dimming may be desired when a given display system is used in various ambient lights. For example, an end-user using a smart glasses display will desire dimming to occur when s/he moves from outside light into a room or vice versa (e.g. to reduce blinding), or when entering then exiting a tunnel while driving. Dimming may be triggered by external sensors that activate and/or deactivate dimming. For example, dimming may be performed by a system on board a vehicle, when the vehicle exits a tunnel into daylight or more generally, when a system is operated in bright rather than dark ambient illumination, as sensed by external brightness sensors.

Co-owned US patent document US20170214893A1, for example, describes several methods for dimming and a designer or end-user may select any of those methods or any method known in the art, or indeed any combination of those methods (e.g. using each of plural methods to achieve a certain dimming factor (aka dimming ratio), yielding a composite method which achieves a total dimming factor which exceeds, and is typically a product of, the dimming factors achieved individually, by each of the dimming methods included in the composite method).

Any suitable dimming method may be applied, when using the system of the present invention. For example, one dimming method which may be used (aka dimming method 1) includes scaling down pixel data. E.g. as described in co-owned US patent document US20170214893A1 available at the following https link: https://patents.google.com/patent/US20170214893A1/en. For example: divide Data_in by a dimming factor (DF_div) that is greater than 1.

Generally, the methods described in co-owned US patent document US20170214893A1 may be used as-is in combination with the methods (aka smart thresholding techniques) shown and described herein. When using the LDR_dimm method for laser driver dimming, described in co-owned US patent document US20170214893A1, correction may be effected to compensate for the proposed threshold technique. For example, if a designer or user selects LDR dimd by setting LDR_dimm>1 compensation may be provide due to the impact to smart threshold e.g. as described herein.

Each dimming method achieves its own dimming ratio, and to achieve a particularly high dimming factor a designer (or user) may use plural dimming methods (e.g. as known in the art and/or as described in co-owned U.S. Ser. No. 10/277,873B2, either as alternatives or simultaneously, combining all or plural available dimming methods, such that the plural dimming methods, together, provide a dimming factor higher than the dimming factors that could have been realized by using only one dimming method in isolation. A particular advantage of certain embodiments is that the provision of a "smart" threshold current as shown and described herein can be used as is in all dimming methods, which enables various dimming methods to be used (e.g. all or any subset of the methods described in co-owned U.S. Ser. No. 10/277,873 either selectably or in combination. It is appreciated that, e.g. when LDR_dimming is used which controls the gain of Digital to Analog Converter A is used, then operation 530 may be added to the method of FIG. 5, so as to optimize handling of LDR_dimm ((termed DF_gain in the above-referenced co-owned patent document)) in combination with any of the methods (aka smart threshold methods) shown and described herein.

Dimming method 2, e.g. as described above, may be used to change Digital to Analog Converter A's gain. Reducing Digital to Analog Converter A's gain by a laser driver (LDR)_Dimm factor (termed DF_gain in the above-referenced co-owned patent document), reduces I_color by the same factor.

According to certain embodiments, FIG. 5's operation 530 is performed only when dimming method 2 is used, and need not be performed when dimming methods other than dimming method 2, described in this co-owned patent document https://patents.google.com/patent/US20170214893A1/en, are employed.

It is appreciated that dimming method 2 may be performed plural times, e.g. once for each channel (e.g. 3 times, for channels R, G and B respectively). Any known method for DAC_A_Thr calibration (e.g. for the threshold current of Digital to Analog Converter A) may be employed.

It is appreciated that, as described in the above-referenced co-owned patent document, "any one, any two or all three of the following elements or components or control parameters (or other suitable laser driver control parameters) can independently be used, to control data current to the laser diode, thereby to provide controlled dimming of a laser-based (e.g. laser beam-generated) display: a) Laser pixel width
  b) Laser driver Data Reference DAC (Digital to Analog Converter) gain And optionally also
  c) Data value division"

FIG. 5's operation 530 is typically performed only when parameter b (laser driver data reference DAC (digital to analog converter) gain) is used (either on its own or together with the above parameters a, c) to control data current to the laser diode e.g. by reducing DAC_A gain, aka data reference DAC gain, or the gain of Digital to Analog Converter A, at the LDR (laser driver) so as to reduce the reference voltage to Data DAC, so as to increase dimming.

However the input data of Digital to Analog Converter A typically includes two components: a shrunk pixel data component and a threshold current (Thr) component. Reducing DAC A gain, the gain of Digital to Analog Converter A, will reduce the Threshold current component as well as the pixel data component whereas it would be more desirable to reduce only the pixel data component and not to change the threshold current component.

To compensate for the reduction in threshold current component in Digital to Analog Converter A the reduction in threshold current in Digital to Analog Converter A may be added to Digital to Analog Converter B.

A detailed description of dimming method 2, according to an embodiment, may be as follows:

Assuming DAC_B_Thr is the threshold current generated by Digital to Analog Converter B, e.g. in operation 520 of the calibration process (see above) DAC_B_Thr is adjusted instead of Channel_Thr register (set Channel_Thr=Black_thr) to get a given black level (e.g. a black level value stipulated for a specific use case and measured by a light meter). Save DAC_B_Thr (the threshold current generated by Digital to Analog Converter B) for use when laser driver (LDR)_Dimm>1. This procedure may be added as operation 530 to the calibration process of FIG. 5.

If LDR_Dimm=1 (no laser driver (LDR) dimming): there is no need to use Digital to Analog Converter B for compensating reduction in Threshold current. I_thr=0.

If LDR_Dimm>1 compensation for the reduction in threshold current at Digital to Analog Converter A by Digital to Analog Converter B is typically effected, e.g. as follows:
1) Set DAC A gain, the gain of Digital to Analog Converter A, according to the following equation, reducing I_color current by LDR_Dimm factor: DAC_A_setting=DAC_A_Gain Setting at calibration process/LDR_Dimm And/or
2) Compensate the reduction in threshold current at Digital to Analog Converter A by using Digital to Analog Converter B to drive the threshold current reduction as follows:

DAC $B$ setting=DAC_$B$_Thr×(1−1/LDR_Dimm)

When LDR_Dimm>1 the actual laser current I_laser for black pixels will not be 0, but will instead be equal to: Laser threshold current×(1−1/LDR_Dimm). Therefore for high laser driver (LDR)_Dimm factors the advantage of this technique is ostensibly not large. For example: for laser driver (LDR)_Dimm factor of 10, Black pixel current will be 90% of laser threshold current, saving only 10% of the laser threshold current power. Yet it turns out that even this ostensibly small 10% reduction in Laser threshold current is sufficient to keep the threshold current outside or away from the curve corner, and/or to appreciably reduce the light power at black pixels and/or to appreciably increase the contrast ratio.

Figure 6:
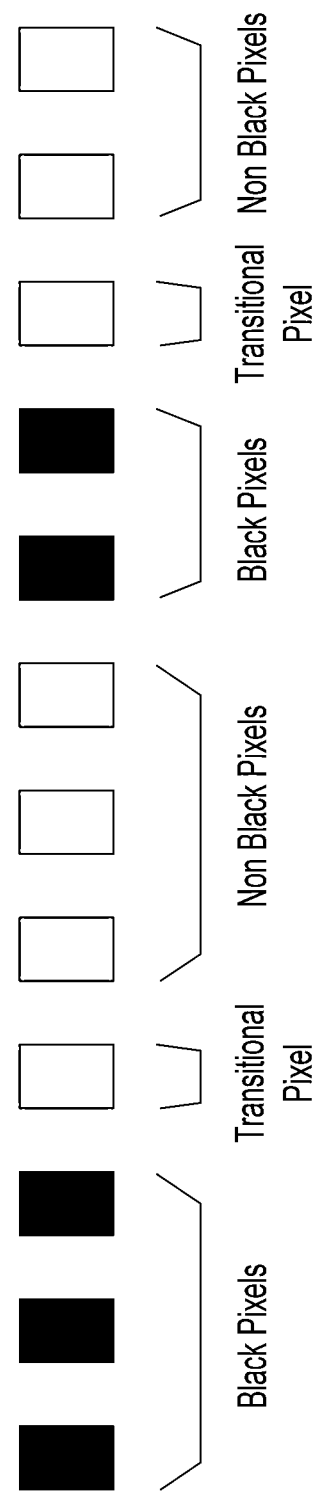
FIGS. 6 and 8 are simplified pictorial illustrations of aspects of certain embodiments.

FIG. 6 shows an example string of pixels which may be generated by an embodiment of the present invention. In the example, 3 true black pixels (which do not require projection) are followed by a single threshold pixel, followed by 3 non black pixels which do require projection, followed again by 3 true black pixels, a threshold pixel, and plural (of which 3 are shown) non-black or projected pixels. More generally, the system of the present invention typically generates strings of pixels including the following sequence, once or more typically repeated more than once: true black pixel/s, followed by one or more threshold pixels, followed by non-black pixel/s. In each repetition, the number of true black pixel/s and/or threshold pixel/s and/or non-black pixel/s, may differ e.g. in the first repetition there may be more or less true black pixel/s, and/or more or less threshold pixel/s, and/or more or less threshold pixel/s, relative to the second repetition. This may depend on the pixel data provided by a conventional pixel processor which typically determines how many black pixels and non-black pixels are desired.

The values of the threshold pixels in FIG. 6 are typically a fraction of the threshold current just before a non zero pixel The flow to generate each black pixel, in the string of FIG. 6, for example, may include all or any subset of the following operations, suitably ordered e.g. as shown in FIG. 7:

Operation 7*a*. Detect True black
Operation 7*b*. check if there are black pixels in display buffer
Operation 7*c*. if there are more than 1 black pixels in the display buffer, activate true black
Operation 7*d*: if there are zero black pixels in the display buffer, go back to threshold current Example Use-Case:
HUD illumination may be provided by a UV laser that is projected onto a florescent material covered with a transparent film mounted on a vehicle's windscreen. This yields a transparent screen. However, when laser energy is transferred to the florescent material, visible light is emitted on the screen. This, conventionally, may be done in a binary mode by modulating the laser on and off according to the required information per pixel on the screen as defined e.g. by the pixel data generated by the pixel processor of FIG. 2.

In order to achieve high resolution and/or in order to achieve fast modulation rates of the lasers, what may be done is, e.g. as shown in FIG. 6, to set the laser diode to a threshold level (to a pixel value which exceeds zero) rather than to off (to a zero pixel value), thereby to generate occasional "threshold pixels", typically just after a sequence of true black pixels terminates and just before a sequence of non-black pixels begins. It is appreciated that in order to increase the image contrast (typically in addition to achieving high resolution and/or fast modulation rates of the lasers), a combination method may be employed, e.g. combining black, gray and yellow pixels, using, say, any of the methods shown and described herein, wherein the laser diode can be either "on" or may be at the threshold level or—in a third operation mode of the laser diode—may generate a "true black" pixel.

As shown in FIG. 1, conventionally, control of the laser employs two parameters: (1) operating current (aka "data current"); and (2) threshold current. Given a desired maximum brightness of symbols shown by a HUD (say) or other display, the contrast ratio limits the minimum brightness of the display background and therefore, production of completely black areas (e.g. to serve as the background of the HUD symbols) is impossible. Since the background is not entirely black, the light coming from that background is visible to the end-user e.g. driver, which is known as the "postcard effect" since the HUD symbols appear to be part of a transparent "postcard" deployed in front of the user. This occurs even with very high contrast ratios, particularly in conditions of low illumination. The human eye can see the boundary of the 'postcard' which reduces user experience quality. Conventionally, this concern has been tackled by making efforts to increase the contrast ratio of display systems in HUDs.

Typically, the threshold current maintains the laser diode as close as possible to the operating point in order to reduce rise time of the laser. However, a threshold current both consumes power and emits undesirable minimal light off the florescent film. Generating the undesirable "postcard effect", which is and a known problem for LCD based displays and/or undesirably and noticeably (to the end-user) reducing the image contrast level. Even a low amount of laser power causes the phenomenon of unwarranted light emitting from the film yielding the "postcard effect". Certain embodiments seek to eliminate unwarranted light by providing true black pixels e.g. as described herein. For example, a (third) "true black" operational mode may be provided in which the unwarranted light is typically eliminated and the image contrast level is typically improved.

It is appreciated that strings of pixels generated by conventional laser drivers include only non-black or projected pixels, with no zero-intensity pixels. There is a projected pixel, in conventional laser drivers, corresponding to all non-black pixel data provided by the pixel processor, to all threshold pixels, and even, undesirably, to all black pixel data provided by the pixel processor). In contrast (pun unintended), according to embodiments herein, the laser driver typically generates, also, true black pixels, by providing windows of time or time intervals with zero projection as opposed to providing the conventional projected pixels whose pixel value may be low, but is not zero.

It is appreciated that the string of pixels which a conventional system would project if given the same pixel data that resulted in FIG. 6, would typically be like FIG. 6, except that the "real black" (zero projection) would be replaced by projected pixels with low but non-zero values E.g. a conventional system might project gray, gray . . . gray, yellow . . . yellow, gray . . . where "yellow" is used to refer to data pixels.

Figure 8:
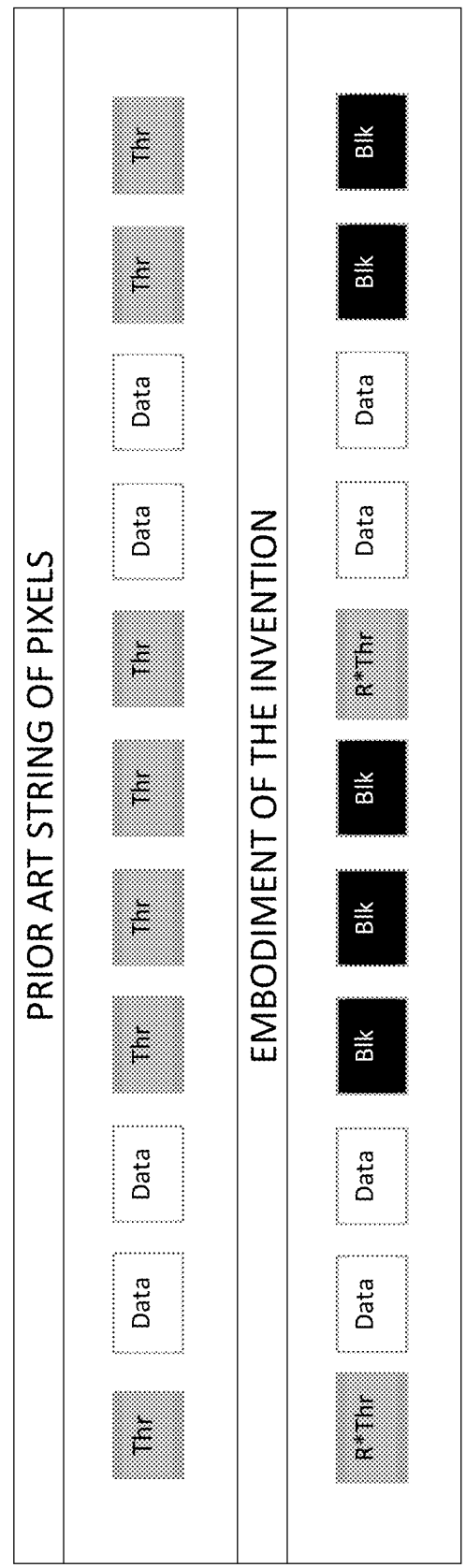

Example: an example string of pixels which may be generated by an embodiment of the present invention is shown in FIG. 8, bottom row, to be:

R×thr, data, data, black, black, black, R×thr, data, data, black.

This may be generated, according to an embodiment, when the desired pixel values include a string of 3 non-black pixels, followed by a string of 4 desirably black pixels, followed by a string of 2 non-black pixels, followed by a string of only one desirably black pixel (the lengths of the strings—3, 4, 2 and 1—are of course merely exemplary).

Typically, all pixels have a uniform duration.

It is appreciated that both conventionally and according to embodiments herein, the last pixel in each string of desirably black pixels is a threshold pixel, however, according to certain embodiments, the threshold pixel's value is R×thr, where thr is the conventional threshold value for the last pixel in a desirably black string (or Channel_Thr as defined herein). However, conventionally, the string of desirably black pixels other than the last pixel in the string, are not true black; their pixel value is thr rather than zero. In contrast, according to embodiments herein, the string of desirably black pixels other than the last pixel in the string, are truly black; their pixel value is zero.

Absent the methods shown and described herein, i.e. using only conventional methods of operation of a laser driver, the string of pixels may be:

thr, data, data, black, thr, thr, thr, thr, data, data, thr.

Thus, the initial threshold pixel in the conventional string (which precedes the first run of data pixels) is replaced, according to certain embodiments, by a pixel whose value is R×thr. The run of data pixels follows, both in the conventional string and in the string of pixels provided according to certain embodiments, followed, according to certain embodiments, by a run of true black pixels (rather than threshold pixels as is conventional) followed by another pixel whose value is R×thr, followed by another string of data pixels, then another string of black pixels, etc. it is appreciated that the length of the runs of data pixels (both are shown to be 2 pixels long) and the length of the run of black pixels (3 pixels long) is merely exemplary.

It is appreciated that conventional systems may generate threshold (also termed herein gray) pixels, before and after yellow (data) pixels whereas according to certain embodiments herein, gray pixels are generated after black pixels but not before. Also, according to certain embodiments herein, 2 different gray values may be provided, a first gray value (aka R×Thr) after a sequence of black pixels, and a second gray value (aka Thr) after a sequence of yellow (data) pixels.

For threshold pixels, the projected light level is typically not visible; any suitable non-visible light level (hence any suitable threshold current) may be used for threshold pixels, which act to cut or reduce the rise time of the laser diode, relative to what the rise time would be in a situation where no threshold pixel is provided.

"Threshold" pixels typically appear at points of transition between desirably black and non-black pixel strings e.g. as shown in FIG. 8.

It is appreciated that the threshold pixels provided in accordance with certain embodiments may be the same as the threshold pixels which exist in conventional systems in the special case that R=1.

It is appreciated that when the pixel processor defines a sequence of n desirably black pixels, according to certain embodiments, a sequence one pixel shorter, i.e. only n−1 truly black pixels are projected, followed by a threshold pixel whose value is R×Thr.

Alternatively or in addition, if the pixel processor defines a sequence of m yellow or non-black pixels, then according to certain embodiments, a sequence one pixel shorter, i.e. only m−1 yellow or non-black pixels may be projected, followed by a threshold pixel whose value IS Thr.

Typically, during black pixels the current through the laser is forced to zero. A threshold pixel (e.g. as shown in FIG. 6) is typically a transitory or transitional pixel and is typically is driven just before a non-black or projected pixel. In the embodiment of FIG. 4, Data_out=R*Thr one or two clock cycles (say before projected, or non-black, pixels It is appreciated that when data is projected by, say, an Augmented Reality (AR) display system, automotive display system or Head-Up-Display, the display or its laser driver typically has timing and synchronization software configured to provide real-time synchronization between a scanning operation of MEMS scanning mirrors and laser drivers. Thanks to this software, the system can estimate in advance when to reduce the laser current I_laser to zero (e.g., when the "projected" data is about to be black; typically when data_in is less than the black_thr, as shown in FIGS. 3 and 4).

This estimating occurs in the Pixel processor of FIG. 2, also termed herein the "data flow block" or "display buffer management" block.

Each time a true black (or real black or perfect black) pixel is followed, e.g. in the pixel data, by "projected" pixel/s which are not black, a threshold current mode could be implemented (typically only one threshold pixel followed by the projected pixel/s) which eliminates/reduces the post-card effect by reducing unwarranted light generally, typically to zero.

In an example, 3-channel embodiment, the current provided, for threshold pixels may be I_THR for each of the r, g, b channels, as generated by the digital-to-analog converter (aka DAC) B of the laser driver's R, G and B channels respectively.

The threshold pixel that is projected may correspond to the last of the black pixels (in the pixel data generated by the pixel processor), in which case one less black pixel is "projected", at zero intensity (or more accurately, not projected), or may be the first of the projected pixels (in the pixel data generated by the pixel processor), in which case one less non-black pixel is typically projected, and could even be both.

It is appreciated that the utility of the embodiments shown and described herein is not limited to HUD'S, or to UV lasers, or to lasers projected onto florescent material which may be covered by a transparent film.

It is appreciated that the embodiments herein are applicable to a wide variety of use cases, such as but not limited to display applications in which, typically, the display is used by end-users who transit from bright light environments (bright ambient light) to low light environments and/or vice versa, including but not limited to HUDs, smart glasses and mobile phone display screens. It is appreciated that use-cases are not however limited to transparent displays and may also include back lighted displays.

Embodiments herein are applicable to applications, such as wearables, in which reduction of power consumption is desirable.

Use-cases may employ lasers to generate the display, such as but not limited to UV lasers.

Any parameters described herein may be pre-set in the factory or may be configured via an API, post-factory, or may be configured by an end-user, via a suitable user interface.

It is appreciated that according to certain embodiments, threshold pixels are provided when transitioning from desirably black to non-black, but (unlike the prior art) threshold pixels are not present when transitioning from non-black to desirably black, according to certain embodiments.

It is appreciated that typically, each pixel corresponds to a time interval and the time interval associated with each pixel is typically uniform over all pixels, such that the time interval associated with a string of P pixels is P times the time interval associated with a single pixel.

Typically, the threshold pixel is the last of the desirably black pixels, just before each transition from a black string to a non-black or "data" string. Alternatively however, the threshold pixel may be the first of the non-black pixels, e.g. Just after each transition from a black string to the non-black string.

If desired, plural threshold pixels may be provided when transitioning from a black string to a non-black string.

Threshold pixels may if desired have a value of THR, rather than R×THR.

It is appreciated that terminology such as "mandatory", "required", "need" and "must" refer to implementation choices made within the context of a particular implementation or application described herewithin for clarity and are not intended to be limiting since in an alternative implantation, the same elements might be defined as not mandatory and not required or might even be eliminated altogether.

Components described herein as software may, alternatively, be implemented wholly or partly in hardware and/or firmware, if desired, using conventional techniques, and vice-versa. Each module or component or processor may be centralized in a single physical location or physical device or distributed over several physical locations or physical devices.

Included in the scope of the present disclosure, inter alia, are electromagnetic signals in accordance with the description herein. These may carry computer-readable instructions for performing any or all of the operations of any of the methods shown and described herein, in any suitable order including simultaneous performance of suitable groups of operations as appropriate. Included in the scope of the present disclosure, inter alia, are machine-readable instructions for performing any or all of the operations of any of the methods shown and described herein, in any suitable order; program storage devices readable by machine, tangibly embodying a program of instructions executable by the machine to perform any or all of the operations of any of the methods shown and described herein, in any suitable order i.e. not necessarily as shown, including performing various operations in parallel or concurrently rather than sequentially as shown; a computer program product comprising a computer useable medium having computer readable program code, such as executable code, having embodied therein, and/or including computer readable program code for performing, any or all of the operations of any of the methods shown and described herein, in any suitable order; any technical effects brought about by any or all of the operations of any of the methods shown and described herein, when performed in any suitable order; any suitable apparatus or device or combination of such, programmed to perform, alone or in combination, any or all of the operations of any of the methods shown and described herein, in any suitable order; electronic devices each including at least one processor and/or cooperating input device and/or output device and operative to perform e.g. in software any operations shown and described herein; information storage devices or physical records, such as disks or hard drives, causing at least one computer or other device to be configured so as to carry out any or all of the operations of any of the methods shown and described herein, in any suitable order; at least one program pre-stored e.g. in memory or on an information network such as the Internet, before or after being downloaded, which embodies any or all of the operations of any of the methods shown and described herein, in any suitable order, and the method of uploading or downloading such, and a system including server/s and/or client/s for using such; at least one processor configured to perform any combination of the described operations or to execute any combination of the described modules; and hardware which performs any or all of the operations of any of the methods shown and described herein, in any suitable order, either alone or in conjunction with software. Any computer-readable or machine-readable media described herein is intended to include non-transitory computer- or machine-readable media.

Any computations or other forms of analysis described herein may be performed by a suitable computerized method. Any operation or functionality described herein may be wholly or partially computer-implemented e.g. by one or more processors. The invention shown and described herein may include (a) using a computerized method to identify a solution to any of the problems or for any of the objectives described herein, the solution optionally include at least one of a decision, an action, a product, a service or any other information described herein that impacts, in a positive manner, a problem or objectives described herein; and (b) outputting the solution.

The system may if desired be implemented as a network—e.g. web-based system employing software, computers, routers and telecommunications equipment as appropriate.

Any suitable deployment may be employed to provide functionalities e.g. software functionalities shown and described herein. For example, a server may store certain applications, for download to clients, which are executed at the client side, the server side serving only as a storehouse. Any or all functionalities e.g. software functionalities shown and described herein may be deployed in a cloud environment. Clients e.g. mobile communication devices such as smartphones may be operatively associated with but external to the cloud.

The scope of the present invention is not limited to structures and functions specifically described herein and is also intended to include devices which have the capacity to yield a structure, or perform a function, described herein, such that even though users of the device may not use the capacity, they are if they so desire able to modify the device to obtain the structure or function.

Any "if-then" logic described herein is intended to include embodiments in which a processor is programmed to repeatedly determine whether condition x, which is sometimes true and sometimes false, is currently true or false and to perform y each time x is determined to be true, thereby to yield a processor which performs y at least once, typically on an "if and only if" basis e.g. triggered only by determinations that x is true and never by determinations that x is false.

Any determination of a state or condition described herein, and/or other data generated herein, may be harnessed for any suitable technical effect. For example, the determination may be transmitted or fed to any suitable hardware, firmware or software module, which is known or which is described herein to have capabilities to perform a technical operation responsive to the state or condition. The technical operation may for example comprise changing the state or condition or may more generally cause any outcome which is technically advantageous given the state or condition or data, and/or may prevent at least one outcome which is disadvantageous given the state or condition or data. Alternatively or in addition, an alert may be provided to an appropriate human operator or to an appropriate external system.

Features of the present invention, including operations, which are described in the context of separate embodiments may also be provided in combination in a single embodiment. For example, a system embodiment is intended to include a corresponding process embodiment and vice versa. Also, each system embodiment is intended to include a server-centered "view" or client centered "view", or "view" from any other node of the system, of the entire functionality of the system, computer-readable medium, apparatus, including only those functionalities performed at that server or client or node. Features may also be combined with features known in the art and particularly although not limited to those described in the Background section or in publications mentioned therein.

Conversely, features of the invention, including operations, which are described for brevity in the context of a single embodiment or in a certain order may be provided separately or in any suitable subcombination, including with features known in the art (particularly although not limited to those described in the Background section or in publications mentioned therein) or in a different order. "e.g." is used herein in the sense of a specific example which is not intended to be limiting. Each method may comprise all or any subset of the operations illustrated or described, suitably ordered e.g. as illustrated or described herein.

Devices, apparatus or systems shown coupled in any of the drawings may in fact be integrated into a single platform in certain embodiments or may be coupled via any appropriate wired or wireless coupling such as but not limited to optical fiber, Ethernet, Wireless LAN, HomePNA, power line communication, cell phone, Smart Phone (e.g. iPhone), Tablet, Laptop, PDA, Blackberry GPRS, Satellite including GPS, or other mobile delivery. It is appreciated that in the description and drawings shown and described herein, functionalities described or illustrated as systems and sub-units thereof can also be provided as methods and operations therewithin, and functionalities described or illustrated as methods and operations therewithin can also be provided as systems and sub-units thereof. The scale used to illustrate various elements in the drawings is merely exemplary and/or appropriate for clarity of presentation and is not intended to be limiting.

Any suitable communication may be employed between separate units herein e.g. wired data communication and/or in short-range radio communication with sensors such as cameras e.g. via WiFi, Bluetooth or Zigbee.

It is appreciated that implementation via a cellular app as described herein is but an example and instead, embodiments of the present invention may be implemented, say, as a smartphone SDK; as a hardware component; as an STK application, or as suitable combinations of any of the above.

Any processing functionality illustrated (or described herein) may be executed by any device having a processor, such as but not limited to a mobile telephone, set-top-box, TV, remote desktop computer, game console, tablet, mobile e.g. Laptop or other computer terminal, embedded remote unit, which may either be networked itself (may itself be a node in a conventional communication network e.g.) or may be conventionally tethered to a networked device (to a device which is a node in a conventional communication network or is tethered directly or indirectly/ultimately to such a node).

Any operation or characteristic described herein may be performed by another actor outside the scope of the patent application and the description is intended to include apparatus whether hardware, firmware or software which is configured to perform, enable or facilitate that operation or to enable, facilitate or provide that characteristic.

The terms processor or controller or module or logic as used herein are intended to include hardware such as computer microprocessors or hardware processors, which typically have digital memory and processing capacity, such as those available from, say Intel and Advanced Micro Devices (AMD). Any operation or functionality or computation or logic described herein may be implemented entirely or in any part on any suitable circuitry including any such computer microprocessor/s as well as in firmware or in hardware or any combination thereof.

It is appreciated that elements illustrated in more than one drawings, and/or elements in the written description may still be combined into a single embodiment, except if otherwise specifically clarified herewithin. Any of the systems shown and described herein may be used to implement or may be combined with, any of the operations or methods shown and described herein.

It is appreciated that any features, properties, logic, modules, blocks, operations or functionalities described herein which are, for clarity, described in the context of separate embodiments, may also be provided in combination in a single embodiment except where the specification or general knowledge specifically indicates that certain teachings are mutually contradictory and cannot be combined. Any of the systems shown and described herein may be used to implement or may be combined with, any of the operations or methods shown and described herein.

Conversely, any modules, blocks, operations or functionalities described herein, which are, for brevity, described in the context of a single embodiment, may also be provided separately or in any suitable sub-combination, including with features known in the art. Each element e.g operation described herein may have all characteristics and attributes described or illustrated herein or according to other embodiments, may have any subset of the characteristics or attributes described herein.

It is appreciated that activation of any element described herein may occur via a cell app, mobile app, computer app or any other application software. Any application may be bundled with a computer and its system software or published separately.

The invention claimed is:

1. A laser system operative in conjunction with a laser diode and a pixel source, the system comprising:
   an LDR channel comprising at least one laser driver; and
   at least one controller, comprising a pixel processor or pixel data conversion block, which receives, from said pixel source, black and non-black pixel values each respectively associated with a time interval, each value including at least one color component, and responsively, controls the laser driver to provide, to the laser diode, non-zero current during a first time interval associated with at least one of the nonblack pixel values and to provide zero current to the laser diode during a second time interval associated with at least one of the black pixel values, thereby to cause the laser diode to project light during the first time interval which is associated with at least one of the non-black pixel values but to project no light during the second time interval which is associated with at least one of the black pixel values, yielding a display including non-black regions corresponding to non-black pixel values and true-black regions corresponding to black pixel values.

2. The laser system of claim 1 wherein said laser driver includes a first digital-to-analog converter generating a first component of the current, according to pixel data modified by the controller, and a second digital-to-analog converter generating a second component, which is fixed irrespective of pixel data from the controller, and wherein the current provided to the laser diode is a sum of the first and second components.

3. The laser system of claim 2 and wherein gain of the first digital-to-analog converter is calibrated, thereby to achieve white color calibration, when Data_in is not shrunk, by forcing K=1 where K is a shrinking factor by which a Data_in value entering the controller is shrunk each time a Data_in pixel value is above a "black_thr" threshold and the second digital to analog converter is blocked, and generates zero current.

4. The laser system of claim 3 wherein, typically, the controller receives Data_in from the pixel source and converts said Data_in to Data_out, each time Data_in is greater than a threshold, aka Black_thr threshold, by adding a fixed value to a difference between said Data_in and said black_Thr threshold after first shrinking said difference by a shrinking factor of K and rounding,
wherein the Channel_Thr register is set to said Black_thr threshold, for all laser driver channels, which forces the shrinking factor K to 1 for all channels.

5. The laser system of claim 2 wherein calibration of a Channel_Thr register residing in the controller causes the threshold current to be set by the first digital-to-analog converter instead of by the second digital-to-analog converter which is blocked.

6. The laser system of claim 2 wherein a threshold current for a Data_in value which exceeds a Black_thr threshold by 1, thereby to constitute a lowest Data_in pixel value that generates laser current, is calibrated by adjusting the Channel_Thr register for driving threshold current, to the laser diode via the first digital-to-analog converter.

7. The laser system of claim 1 wherein the controller receives Data_in from the pixel source and converts said Data_in to Data_out, each time Data_in is greater than a threshold, aka Black_thr threshold, by adding a fixed value to a difference between said Data_in and said black_Thr threshold after first shrinking said difference by a shrinking factor of K and rounding.

8. The laser system of claim 1 wherein the controller receives Data_in from the pixel source and converts said Data_in to Data_out=0, each time Data_in is equal to or lower than a "Black_thr" threshold, thereby to control the laser diode to generate zero light projection at a time associated with said Data_in value.

9. The laser system of claim 1 wherein laser response time is reduced, when a non-black pixel appears after a string of black pixels, by predicting occurrence of the non-black pixel at least one clock in advance and, responsively, increasing current provided to the laser diode by a percentage, R, of a threshold current, at least one clock before the non-black pixel occurs.

10. The laser system of claim 1 wherein the pixel source comprises a buffer such as a display buffer.

11. The laser system of claim 1 wherein the pixel source comprises a pixel generator.

12. The laser system of claim 1 wherein said at least one driver comprises plural laser drivers corresponding to plural color component channels.

13. A method for operating a laser diode, the method comprising:
providing at least one controller, comprising a pixel processor or pixel data conversion block, which receives, from a pixel source, black and non-black pixel values each respectively associated with a time interval, each value including at least one color component, and, responsively,
controlling an LDR channel comprising a laser driver to provide, to the laser diode, non-zero current during a first time interval associated with at least one of the non-black pixel values and to provide zero current to the laser diode during a second time interval associated with at least one of the black pixel values, thereby to cause the laser diode to project light during the first time interval which is associated with at least one of the non-black pixel values but to project no light during the second time interval which is associated with at least one of the black pixel values, yielding a display including non-black regions corresponding to non-black pixel values and true-black regions corresponding to black pixel values.

14. The method of claim 13 wherein at least one dimming method is used to provide dimming of light projected by the laser diode.

15. The method of claim 13 wherein plural dimming methods are used to provide dimming of light projected by the laser diode by plural dimming factors respectively, thereby to achieve total dimming by a total factor which is a product of the plural dimming factors.

16. A method according to claim 13 wherein a shrinking factor K is used to scale a Data_in range above a black_thr value, to a Data out range above a Channel_Thr value.

17. A method according to claim 16 wherein said shrinking factor K is computed by dividing a difference between Data_max the maximum data_in value, and Channel Thr by a difference between Data_max and a black_thr value.

18. A method according to claim 13 which is configured to predict at least one black pixel string including at least one black pixel.

* * * * *